US012663822B2

(12) United States Patent
Zhang et al.

(10) Patent No.: US 12,663,822 B2
(45) Date of Patent: Jun. 23, 2026

(54) FREQUENCY SPREAD SPECTRUM (FSS) OSCILLATOR

(71) Applicant: TEXAS INSTRUMENTS INCORPORATED, Dallas, TX (US)

(72) Inventors: Liang Zhang, Beijing (CN); Yutao Wang, Rizhao (CN); Xinyu Yin, Fengtai (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/749,200

(22) Filed: Jun. 20, 2024

(65) Prior Publication Data

US 2025/0390126 A1      Dec. 25, 2025

(51) Int. Cl.
| | |
|---|---|
| *G05F 1/56* | (2006.01) |
| *H03K 3/0231* | (2006.01) |
| *H03K 5/24* | (2006.01) |
| *H03K 19/20* | (2006.01) |

(52) U.S. Cl.
CPC ............. *G05F 1/56* (2013.01); *H03K 3/0231* (2013.01); *H03K 5/24* (2013.01); *H03K 19/20* (2013.01)

(58) Field of Classification Search
CPC . G05F 1/56; H03K 5/24; H03K 19/20; H03K 3/0231
USPC ..................................................... 331/111, 78
See application file for complete search history.

(56) References Cited

U.S. PATENT DOCUMENTS

2013/0265093 A1*  10/2013  Zhang ................... H03K 3/0231
                                                              327/299
2014/0176249 A1*   6/2014  Wu ........................... H03B 5/04
                                                              331/111

* cited by examiner

*Primary Examiner* — Arnold M Kinkead
(74) *Attorney, Agent, or Firm* — Frank D. Cimino

(57) ABSTRACT

In examples, an oscillator comprises a reference voltage generator circuit configured to increase and decrease a reference voltage responsive to each pulse of a clock signal based on a comparison of the reference voltage to upper and lower boundaries. The oscillator also comprises an oscillation circuit coupled to the reference voltage generator circuit and configured to provide the clock signal, the clock signal having a frequency that varies based on the reference voltage.

20 Claims, 7 Drawing Sheets

700

702 — COMPARING A REFERENCE VOLTAGE TO ONE OF A PAIR OF SECONDARY REFERENCE VOLTAGES

704 — INCREASING OR DECREASING THE REFERENCE VOLTAGE AT EACH PULSE OF A CLOCK SIGNAL BASED ON THE COMPARISON

706 — GENERATING THE CLOCK SIGNAL TO HAVE A FREQUENCY THAT VARIES ACCORDING TO THE REFERENCE VOLTAGE

FREQUENCY SPREAD SPECTRUM (FSS) OSCILLATOR

BACKGROUND

An oscillator is an electronic device that generates repetitive oscillating signals, typically in the form of electrical waveforms such as sine waves or pulses. These oscillating signals have a specific frequency and amplitude determined by the design and configuration of the oscillator circuit. By continuously generating stable and predictable oscillations, oscillators enable precise synchronization, timing control, and signal generation useful for the operation of electronic devices and systems across a wide range of industries and technologies.

SUMMARY

In examples, an oscillator comprises a reference voltage generator circuit configured to increase and decrease a reference voltage responsive to each pulse of a clock signal based on a comparison of the reference voltage to upper and lower boundaries. The oscillator also comprises an oscillation circuit coupled to the reference voltage generator circuit and configured to provide the clock signal, the clock signal having a frequency that varies based on the reference voltage.

DETAILED DESCRIPTION

Electromagnetic interference (EMI) poses a growing concern in automobiles due to the proliferation of electronic systems. As vehicles incorporate more electronics for engine control, infotainment, and connectivity, the proximity of these systems within the vehicle creates opportunities for EMI to disrupt their operation. Oscillators, which are essential components in automotive electronics, can contribute to EMI when not properly shielded or filtered. Oscillators can interfere with nearby electronic components, leading to degraded performance or malfunction. Oscillator EMI can be particularly problematic in these respects when the oscillator frequency is centered on a narrow frequency band.

This disclosure describes various examples of an oscillator configured to eliminate the peak emissions present in traditional oscillators by spreading emissions across a wider range of frequencies. By dynamically adjusting the oscillator's frequency of operation across the wider range of frequencies rather than on a narrow frequency band or on a single frequency, energy is distributed across a number of different frequencies instead of being concentrated on the narrow frequency band or single frequency. Such frequency spreading reduces the peak amplitude of the oscillating signal, minimizing the likelihood of interference with other electronic devices operating on specific frequency bands. Additionally, such frequency spreading can make signals more resilient to interference and noise, resulting in improved signal integrity and reduced susceptibility to EMI-induced disruptions. Accordingly, EMI and its deleterious effects are mitigated. In examples, the oscillator disclosed herein includes a reference voltage generator circuit configured to increase and decrease a reference voltage responsive to each pulse of a clock signal based on a comparison of the reference voltage to upper and lower boundaries. The oscillator also comprises an oscillation circuit coupled to the reference voltage generator circuit and configured to provide the clock signal. The clock signal has a frequency that varies based on the reference voltage.

Figure 1:
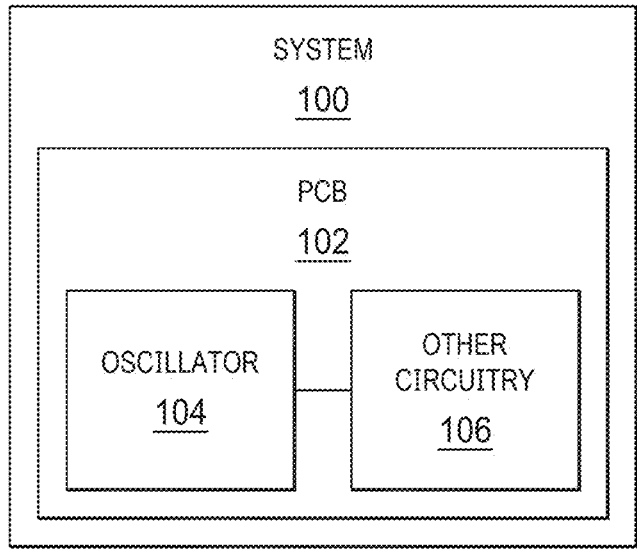
FIG. 1 is a block diagram of a system including a frequency spread spectrum (FSS) oscillator in accordance with examples described herein.

FIG. 1 is a block diagram of a system including a frequency spread spectrum (FSS) oscillator in accordance with examples described herein. Specifically, FIG. 1 depicts a system 100, such as an automobile, an aircraft, a watercraft, a spacecraft, a video game console, an arcade video game unit, a smartphone, an entertainment device, an appliance, a laptop computer, a desktop computer, a tablet, a notebook, or any other suitable type of system or device. The system 100 includes a printed circuit board (PCB) 102 to which an FSS oscillator 104 is coupled. The oscillator 104 is an FSS oscillator, various examples of which are described herein. The PCB 102 is also coupled to other circuitry 106, such as one or more controllers, application-specific integrated circuits, etc., which may receive and use oscillating signals from the FSS oscillator 104.

Figure 2A:
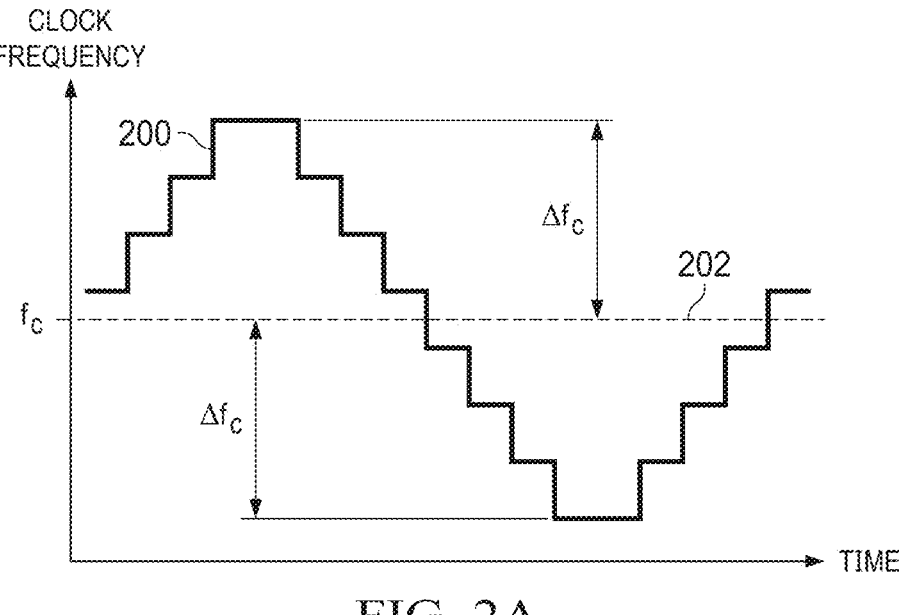
FIGS. 2A and 2B are graphs showing the operational behavior of an FSS oscillator in accordance with examples described herein.
Figure 2B:
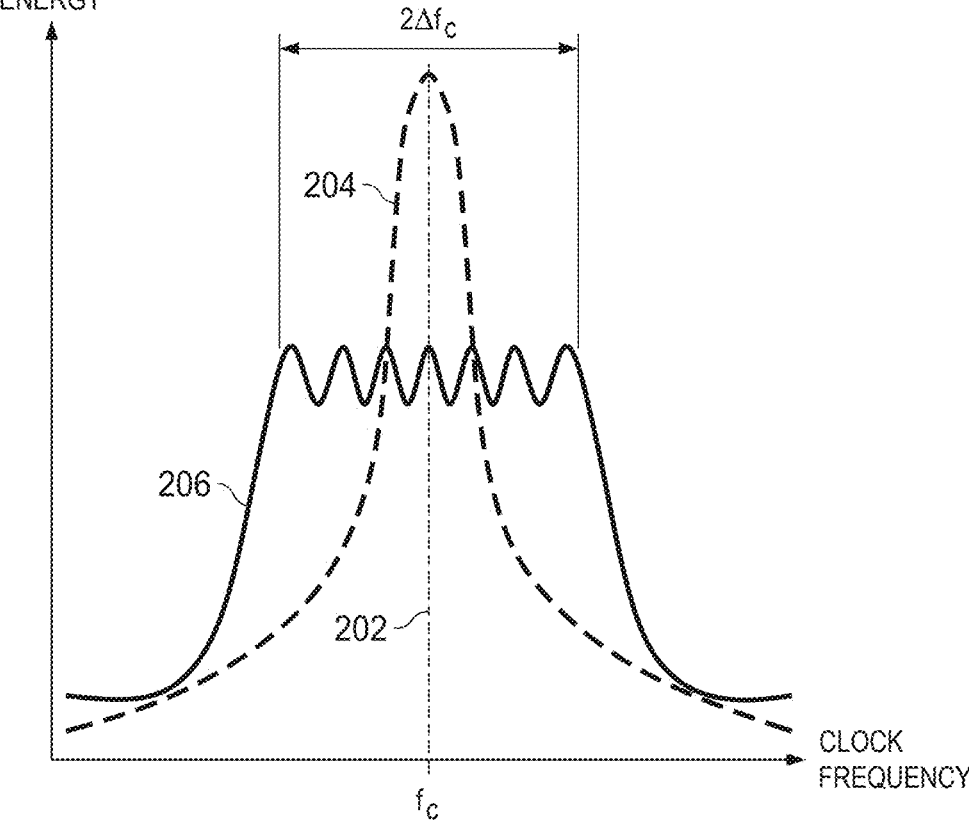

FIGS. 2A and 2B are graphs showing the operational behavior of the FSS oscillator 104 in accordance with examples described herein. In particular, the graph of FIG. 2A shows time on the x-axis and clock frequency on the y-axis. The graph of FIG. 2A includes a waveform 200 depicting how the clock frequency produced by the FSS oscillator 104 (FIG. 1) varies with time, and specifically with respect to a center frequency 202. As shown, the clock frequency of the FSS oscillator 104 varies in a sinusoidal manner about the center frequency 202, with the variance above the center frequency 202 indicated by $\Delta f_c$ and with the variance below the center frequency 202 also indicated by $\Delta f_c$.

In FIG. 2B, the x-axis indicates clock frequency, and the y-axis indicates energy. Waveform 204 indicates the frequency distribution in traditional oscillators, which is focused on the center frequency 202. In contrast, waveform 206 depicts the frequency distribution of the FSS oscillator 104, spanning a range of frequencies $2\Delta f_c$, consistent with the frequency variation shown in FIG. 2A and described above. The frequency spread of the FSS oscillator 104 as shown in FIG. 2A and especially in FIG. 2B achieves the technical advantages described above.

Figure 3:
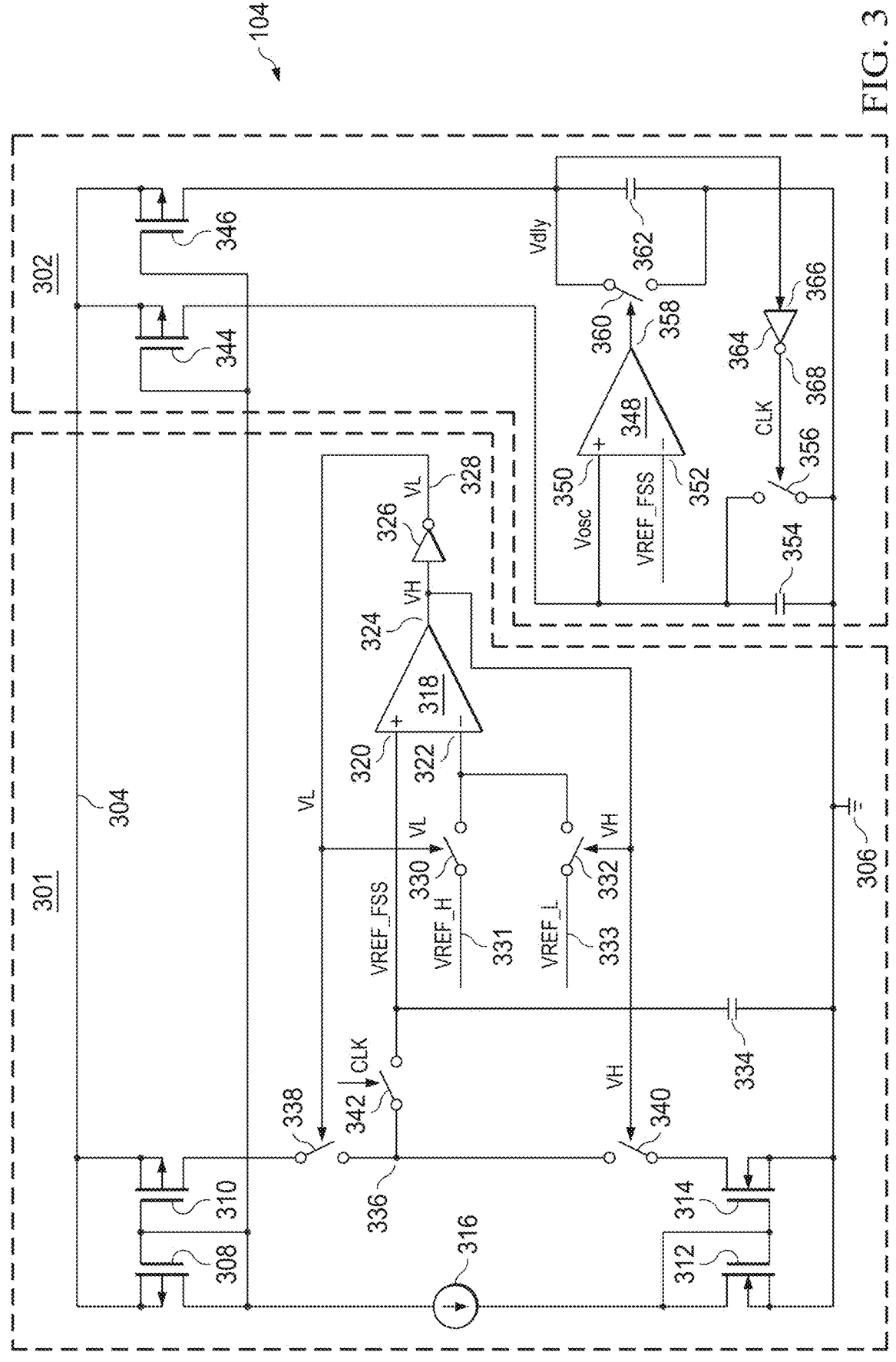
FIG. 3 is a circuit diagram of an FSS oscillator in accordance with examples described herein.

FIG. 3 is a circuit diagram of the FSS oscillator 104 in accordance with various examples, the operation of which is explained further below with reference to FIGS. 4-6. The FSS oscillator 104 may include a reference voltage generator circuit (RVGC) 301 and an oscillation circuit 302 coupled to the RVGC 301. In examples, the RVGC 301 may include a voltage supply (also sometimes referred to as a "voltage rail") 304, a ground terminal 306, and switches 308, 310, 312, and 314. The switches 308, 310, 312, and 314 may be any suitable type of switch, such as a transistor (e.g., field effect transistor (FET), bipolar junction transistor (BJT)). In examples, the switches 308, 310, 312, and 314 are coupled in a current mirror configuration. For instance, control terminals of the switches 308, 310 may be coupled to each other, and control terminals of the switches 312, 314 may be coupled to each other, with the pair of switches 308, 310 coupled to the pair of switches 312, 314 by their respective control terminals and/or non-control terminals. In examples, the switches 308, 310 are p-type metal-oxide-semiconductor FETs (MOSFETs), and the switches 312, 314 are n-type MOSFETs, with the gate terminals of the switches 308, 310 coupled to each other, the source terminals of the switches 308, 310 coupled to each other and to the voltage supply 304, and the drain terminal of the switch 308 coupled to the gate terminals of the switches 308, 310 and to a current source 316. In examples, the gate terminals of the switches 312, 314 are coupled to each other, the source terminals of the switches 312, 314 are coupled to each other and to the ground terminal 306, and the source terminal of the switch 312 is coupled to the gate terminals of the switches 312, 314 and to the current source 316. The current mirror may include additional switches in the oscillation circuit 302, as described below. Other current mirror configurations are contemplated and included in the scope of this disclosure.

The RVGC 301 may include a comparator 318 having an input 320 (e.g., a non-inverting input) and an input 322 (e.g., an inverting input), as well as an output 324. An inverter 326 may be coupled to the output 324 and may have an output 328. A switch 330 (which may be any suitable type of switch, such as a FET or BJT) may be coupled to the input 322, and a switch 332 (which may be any suitable type of switch, such as a FET or BJT) may be coupled to the input 322. A connection 331 may be coupled to the switch 330, and a connection 333 may be coupled to the switch 332. The switches 330, 332 may consistently have opposing states, meaning that when the switch 330 is open, the switch 332 is closed, and vice versa. Accordingly, when the switch 330 is closed, the connection 331 is coupled to the input 322 and the connection 333 is not coupled to the input 322. Conversely, when the switch 332 is closed, the connection 333 is coupled to the input 322, and the connection 331 is not coupled to the input 322.

A capacitor 334 (e.g., approximately 2-5 picofarads) is coupled between the input 320 and the ground terminal 306. A node 336 is coupled to the switch 310 (e.g., to a drain terminal of the switch 310) by way of a switch 338, and the node 336 is coupled to the switch 314 (e.g., to a drain terminal of the switch 314) by way of a switch 340. The switches 338, 340 may be any suitable type of transistor (e.g., FET, BJT). The input 320 is coupled to the node 336 by way of a switch 342, which may be any suitable type of transistor (e.g., FET, BJT).

In examples, the switch 330 is controlled by the output 328. In examples, the switch 332 is controlled by the output 324. In examples, the switch 338 is controlled by the output 328. In examples, the switch 340 is controlled by the output 324. In examples, the switch 342 is controlled by a clock signal CLK, which is a pulse train of variable frequency and is the output of the FSS oscillator 104, as described below.

The signal present on the input 320 is a reference voltage referred to herein as VREF_FSS. As described in detail below, the RVGC 301 operates to produce VREF_FSS and to provide VREF_FSS to the oscillation circuit 302. The oscillation circuit 302 uses VREF_FSS to produce the oscillating clock signal CLK, which is the output of the FSS oscillator 104. The oscillation circuit 302 also provides CLK to the RVGC 301 in a feedback loop to operate the switch 342, as is also described below.

Still referring to FIG. 3, the oscillation circuit 302 may include switches 344 and 346. In examples, the switches 344 and 346 are transistors, such as FETs or BJTs. In examples, the switches 344, 346 are p-type MOSFETs. In examples, the gate terminal of the switch 344 is coupled to the gate terminals of the switches 308, 310, and the gate terminal of the switch 346 is coupled to the gate terminals of the switches 308, 310. In examples, the source terminals of the switches 344, 346 are coupled to the voltage supply 304. In examples, the drain terminal of the switch 344 is coupled to the ground terminal 306 by way of a capacitor 354 (e.g., approximately 0.5-1.5 picofarads). In examples, the drain terminal of the switch 346 is coupled to the ground terminal 306 by way of a capacitor 362 (e.g., approximately 0.05-0.15 picofarads). Accordingly, the switches 344, 346 form part of the current mirror configuration described above. Other configurations are contemplated and included in the scope of this disclosure.

The oscillation circuit 302 may include a comparator 348 having an input 350 (e.g., a non-inverting input) and an input 352 (e.g., an inverting input), as well as an output 358. The input 350 is coupled to the switch 344 (e.g., to the drain terminal of the switch 344) and to the capacitor 354, as shown. The input 352 is coupled to the input 320 in the RVGC 301, thereby providing the signal VREF_FSS from the input 320 to the input 352. The oscillation circuit 302 may include a switch 360 (e.g., a FET or BJT) controlled by the output 358 and coupled in parallel with a capacitor 362 (e.g., approximately 0.05-0.15 picofarads). The oscillation circuit 302 may include an inverter 364 having an input 366 coupled to the capacitor 362, the switch 360, and the switch 346 (e.g., to the drain terminal of the switch 346). The switch 360 and the capacitor 362 also may be coupled to the ground terminal 306. An output 368 of the inverter 364 controls a switch 356 (e.g., a FET or BJT), which may be coupled in parallel with the capacitor 354. The signal CLK is present on the output 368. The output 368 may be coupled to a control terminal of the switch 342 in the RVGC 301, as described above, to provide CLK to the switch 342 as feedback. The output 368 also may be coupled to other circuitry 106 (FIG. 1) that may use CLK in any appropriate manner.

Figure 4:
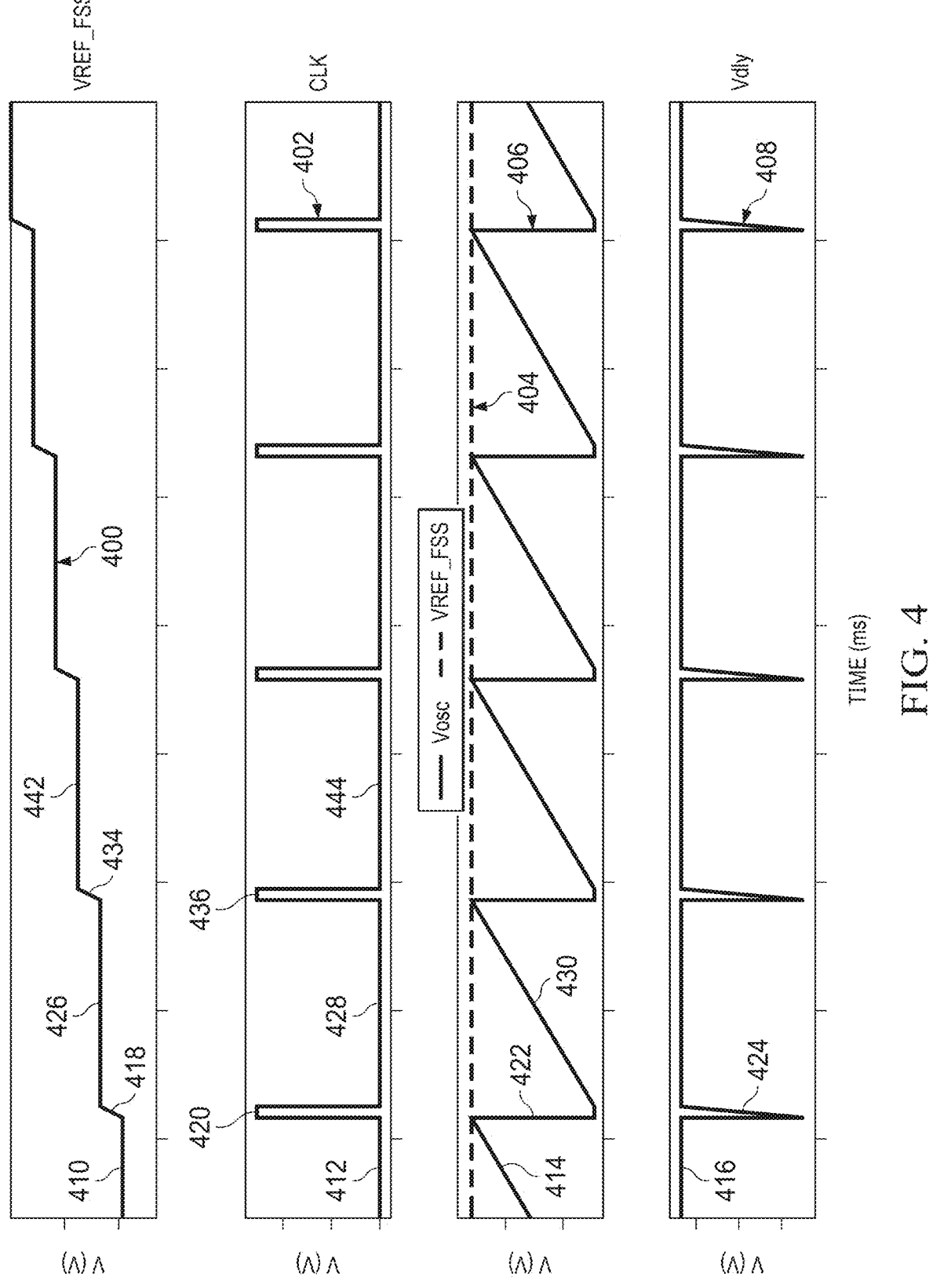
FIGS. 4-6 are graphs showing the operational behavior of an FSS oscillator in accordance with examples described herein.
Figure 5:
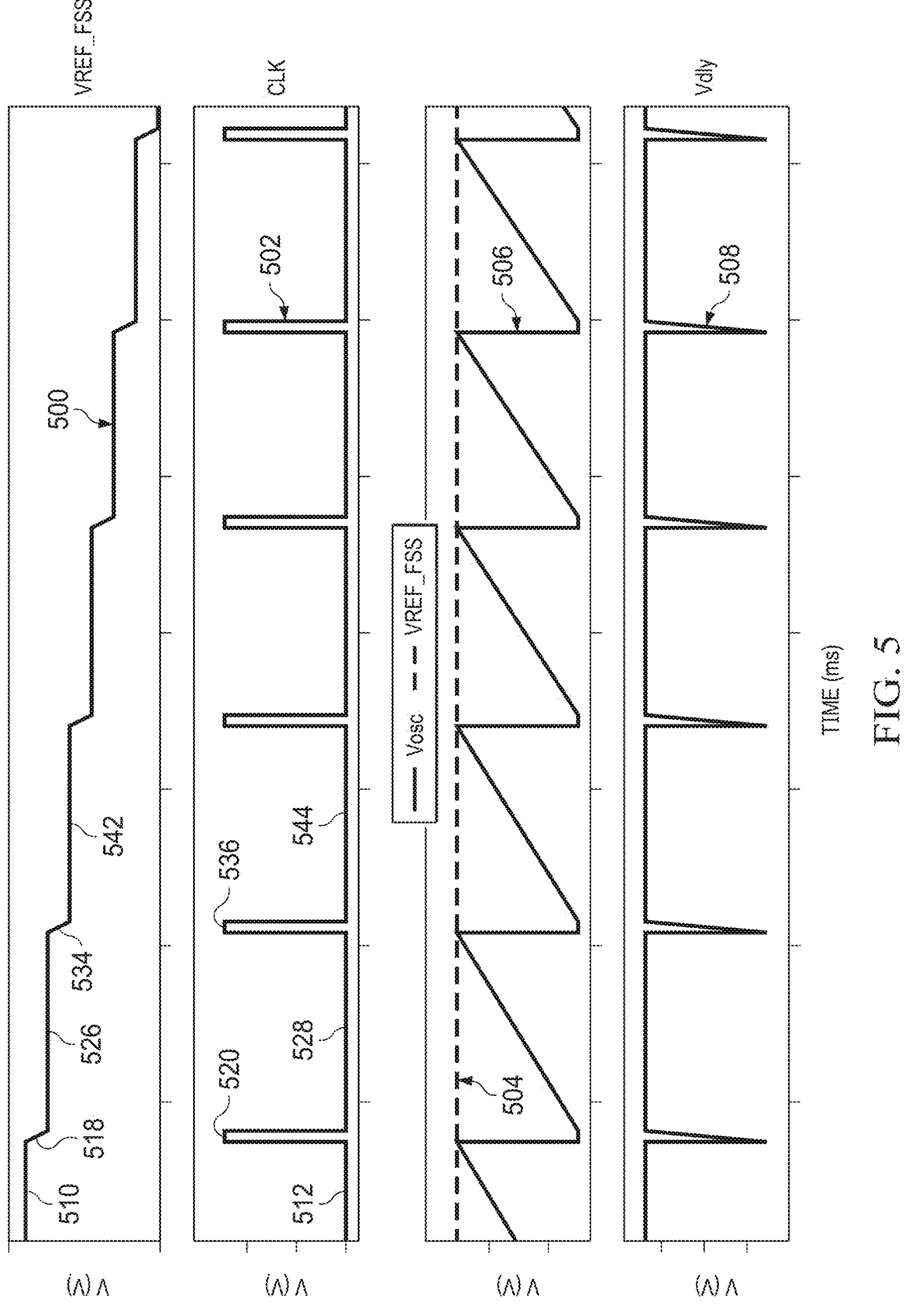
Figure 6:
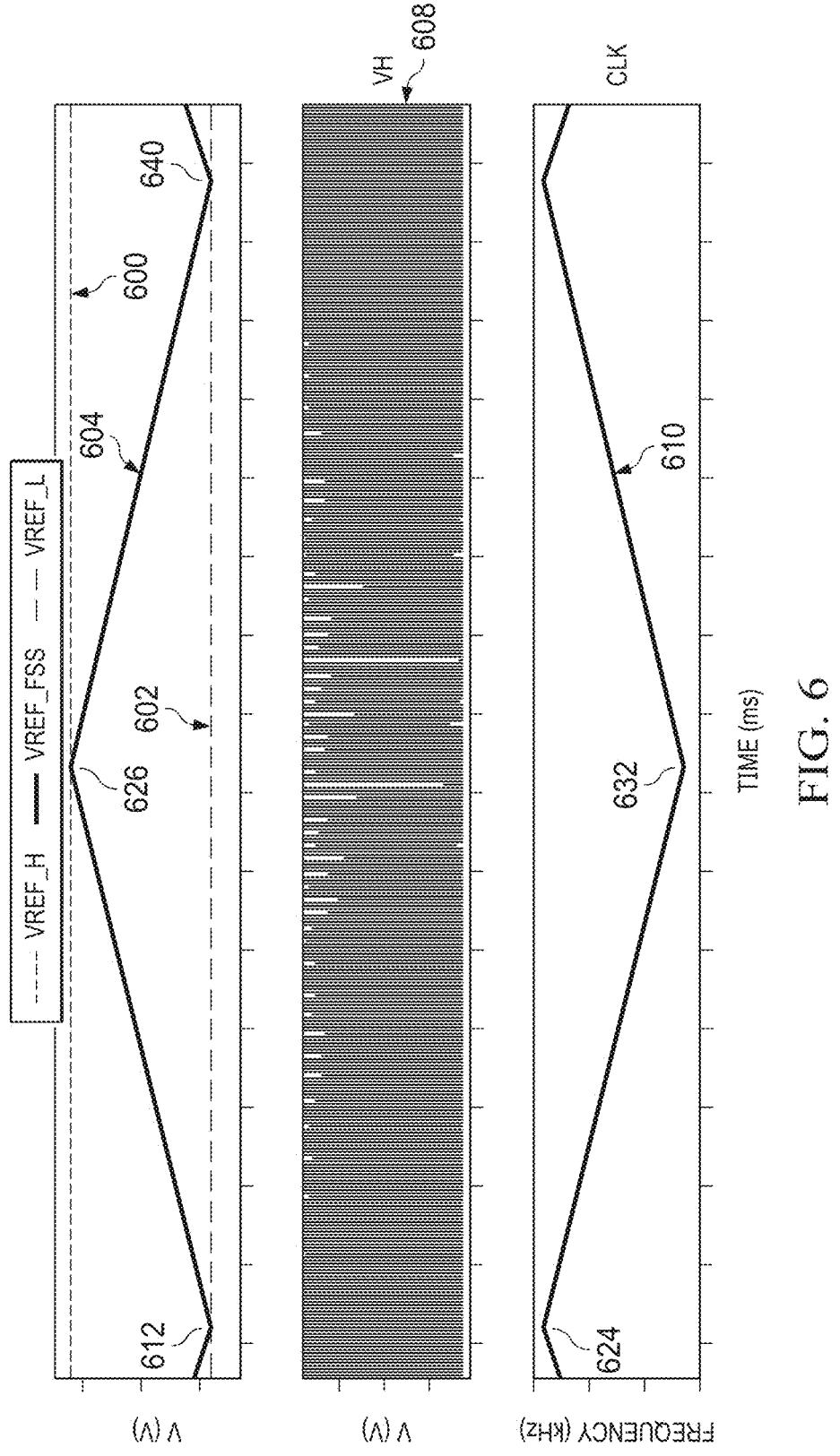

FIGS. 4-6 are graphs showing the operational behavior of the FSS oscillator 104 in accordance with examples described herein. Accordingly, the graphs of FIGS. 4-6 are first introduced, followed by a description of the operation of the FSS oscillator 104 with simultaneous reference to FIGS. 3-6.

FIG. 4 illustrates a graph including waveforms 400, 402, 404, 406, and 408. Together, the waveforms 400, 402, 404, 406, and 408 describe operation of the FSS oscillator 104 when the output 324 in FIG. 3, which is labeled as signal VH, is low (e.g., a binary zero). Waveform 400 shows the behavior of signal VREF_FSS (e.g., on input 320 and input 352 in FIG. 3), with voltage (y-axis) depicted as a function of time (x-axis). Waveform 402 shows the behavior of signal CLK (e.g., on output 368 and the control terminal of switch 342 in FIG. 3), with voltage (y-axis) depicted as a function of time (x-axis). Waveform 406 shows the behavior of Vosc (e.g., the signal on input 350 in FIG. 3), with voltage (y-axis) depicted as a function of time (x-axis). Waveform 404 is a flat line that represents the value of VREF_FSS at any given time and is to be interpreted independently of the y-axis and in relation to the waveform 406. For example, when waveform 406 is below the flat line of waveform 404, Vosc should be interpreted to be below the actual value of VREF_FSS at that time. Similarly, when waveform 406 is above the flat line of waveform 404, Vosc should be interpreted to be above the actual value of VREF_FSS at that time. Waveform 408 shows the behavior of signal Vdly (e.g., the signal on input 366 of FIG. 3), with voltage (y-axis) shown as a function of time (x-axis).

FIG. 5 illustrates a graph including waveforms 500, 502, 504, 506, and 508. Together, the waveforms 500, 502, 504, 506, and 508 describe operation of the FSS oscillator 104 when the output 324 in FIG. 3 is high (e.g., a binary one). Waveform 500 shows the behavior of signal VREF_FSS (e.g., on input 320 and input 352 in FIG. 3), with voltage (y-axis) depicted as a function of time (x-axis). Waveform 502 shows the behavior of signal CLK (e.g., on output 368 and the control terminal of switch 342 in FIG. 3), with voltage (y-axis) depicted as a function of time (x-axis). Waveform 506 shows the behavior of Vosc (e.g., on input 350 in FIG. 3), with voltage (y-axis) depicted as a function of time (x-axis). Waveform 504 is a flat line that represents the value of VREF_FSS at any given time and is to be interpreted independently of the y-axis and in relation to the waveform 506. For example, when waveform 506 is below the flat line of waveform 504, Vosc should be interpreted to be below the actual value of VREF_FSS at that time. Similarly, when waveform 506 is above the flat line of waveform 504, Vosc should be interpreted to be above the actual value of VREF_FSS at that time. Waveform 508 shows the behavior of signal Vdly (e.g., on input 366 of FIG. 3), with voltage (y-axis) shown as a function of time (x-axis).

FIG. 6 illustrates a graph including waveforms 600, 602, 604, 608, and 610. Waveforms 600 and 602 depict reference voltages (VREF_H and VREF_L, respectively) that are provided to the input 322 by way of switches 330, 332 (FIG. 3), respectively. Waveform 604 describes the behavior of VREF_FSS (e.g., the signal on inputs 320, 352). Waveforms 600, 602, and 604 are depicted by voltages (y-axis) as functions of time (x-axis). The waveform 608 shows the signal CLK with voltage (y-axis) as a function of time (x-axis). The waveform 610 shows the signal CLK with frequency (y-axis) as a function of time (x-axis).

The operation of the FSS oscillator 104 is now described with simultaneous reference to FIGS. 3-6. As explained above, the RVGC 301 operates to produce VREF_FSS using CLK, which is produced by the oscillation circuit 302. Further, as explained above, the oscillation circuit 302 operates to produce CLK using VREF_FSS. Accordingly, the operation of the RVGC 301 is first described, followed by a description of the operation of the oscillation circuit 302.

In general, the RVGC 301 operates to maintain VREF_FSS within a hysteresis band, the upper bound of which is defined by VREF_H on connection 331, and the lower bound of which is defined by VREF_L on connection 333. When VREF_H is provided to the input 322 as the reference voltage, each successive closure of switch 342 by CLK incrementally raises VREF_FSS toward VREF_H. Eventually, VREF_FSS reaches the upper bound of the hysteresis band (VREF_H). At that time, the output 324 changes from low to high, which causes VREF_L to be supplied to the input 322 instead of VREF_H. This means that the reference voltage provided on the input 322 is now VREF_L, and thus each successive closure of switch 342 by CLK incrementally decreases VREF_FSS toward VREF_L. Eventually, VREF_FSS reaches the lower bound of the hysteresis band (VREF_L), at which point the reference voltage on input 322 changes back to VREF_H, and the process repeats. Waveforms 600, 602, and 604 in FIG. 6 depict this behavior. At a low inflection point 612, waveform 604, which represents VREF_FSS, reaches the lower bound VREF_L (waveform 602) of the hysteresis band defined by VREF_L (waveform 602) and VREF_H (waveform 600). As waveform 604 reaches VREF_L at the low inflection point 612, the reference voltage provided on input 322 changes from VREF_L to VREF_H as described above, and thus VREF_FSS (waveform 604) begins to rise again toward VREF_H, and the process continues in this manner.

As will be described below, the frequency of CLK varies inversely with the voltage of VREF_FSS. As VREF_FSS rises, the frequency of CLK falls, and vice versa. Thus, VREF_H and VREF_L can be adjusted (e.g., by a user, by circuit logic) as desired to control VREF_FSS, and, by extension, to control the frequency of CLK. For example, VREF_H and VREF_L can both be raised to relatively high voltages or dropped to relatively low voltages to control the absolute frequencies of CLK. Further, the gap between VREF_H and VREF_L can be controlled to control the range of frequencies of CLK, meaning the frequency bandwidth of CLK.

Now that the general operation of RVGC 301 has been described, the specific operation of RVGC 301 is described. Still referring to FIGS. 3-6, assuming VH at output 324 is low, the switch 340 is open, and the switch 332 is also open. The inverter 326 inverts the low VH to produce a high VL on output 328. The high VL causes the switches 330 and 338 to be closed. Accordingly, VREF_H is provided to the input 322 by way of the switch 330, and the node 336 is pulled high by the voltage supply 304 by way of the switch 338 and the switch 310.

The switches 308, 310, 312, 314, 344, and 346 that form the current mirror of the FSS oscillator 104 are always on. For example, because switches 308 and 310 may be p-type MOSFETs, the source terminals of the switches 308 and 310 are tied to the voltage supply 304 and thus the potential across the gate-to-source terminals ($V_{gs}$) is negative, thus ensuring that the switches 308, 310 are on. Similarly, the switches 312, 314 may be n-type MOSFETs, and thus because the source terminals are tied to the ground terminal 306, the potential across the gate-to-source terminals ($V_{gs}$) is positive, thus ensuring that the switches 312, 314 are on. The switches 344, 346 operate similarly to the switches 308, 310 and also remain on. Accordingly, as explained, when the switch 338 is closed, the node 336 is pulled high through the switch 310, which remains on.

Because the node 336 is pulled high, whenever the switch 342 is closed, VREF_FSS on input 320 is pulled higher, meaning that the capacitor 334 is charged further. The longer the switch 342 is closed, the higher VREF_FSS rises, because the capacitor 334 continues to be charged. However, because CLK controls the switch 342, the switch 342 is not kept open or closed for extended periods of time, but rather the switch 342 is repeatedly opened and closed according to the pulses of CLK. During pulses of CLK (when CLK is high), the switch 342 is closed and VREF_FSS is increased incrementally by charging the capacitor 334, and in between pulses of CLK (when CLK is low), the switch 342 is open and VREF_FSS does not change. When CLK is low, VREF_FSS does not appreciably drop, or any such drop is negligible, because the capacitor 334 does not discharge quickly enough before CLK is high again and the capacitor 334 is charged further.

FIG. 4 shows this behavior of the FSS oscillator 104 when VH at output 324 is low. Waveform 400 represents VREF_FSS, and waveform 402 represents CLK. Because VH at output 324 is low in FIG. 4, VREF_H is the reference voltage provided on input 322. Thus, VREF_FSS will be rising, as waveform 400 shows. With each pulse of CLK, VREF_FSS rises incrementally. Thus, for example, VREF_FSS begins at approximately 2.052 V at 410, while CLK is low (412). Upon pulse 420 of CLK, VREF_FSS rises (418). This is because the switch 342 closes, and because node 336 is pulled high when the switch 342 closes, the capacitor 334 is charged further and VREF_FSS is pulled higher. When CLK drops again (428), VREF_FSS stops rising (426). The next pulse 436 of CLK again causes VREF_FSS to rise (434), and again when CLK drops (444), VRE_FSS ceases rising (442). This process continues in this manner.

Eventually, VREF_FSS will reach VREF_H. At this time, the output of the comparator 318 changes from low to high, meaning VH on output 324 becomes high and VL on output 328 becomes low. Consequently, the switches 330, 338 open, and the switches 332, 340 close. Thus, VREF_L is provided to input 322 as the reference voltage of the comparator 318 in lieu of VREF_H. Further, because the switch 340 is closed and the switch 338 is now open, instead of being pulled up by the voltage supply 304, the node 336 is pulled down to ground by the ground terminal 306 through the switch 314. With each pulse of CLK, the switch 342 closes, and each time the switch 342 closes, VREF_FSS is incrementally decreased because the capacitor 334 is discharged by the pulled-down node 336. In this way, VREF_FSS incrementally approaches VREF_L. FIG. 5, which depicts the behavior of the FSS oscillator 104 when VH at output 324 is high, shows this decrementing behavior of VREF_FSS. Specifically, VREF_FSS (waveform 500) begins at 510, when CLK is low (512). When CLK rises during a pulse (520), VREF_FSS is decremented (518), and when CLK falls again (528), VREF_FSS is no longer decremented (526). At the next pulse of CLK (536), VREF_FSS is decremented again (534), and when CLK falls again (544), VREF_FSS is no longer decremented (542). This pattern continues until VREF_FSS reaches VREF_L, at which time VREF_FSS will begin to rise again toward VREF_H, as waveforms 600, 602, 604 illustrate (FIG. 6). In FIG. 5, the waveforms 504, 506, and 508 behave similarly to waveforms 404, 406, and 408, respectively, and thus are not described again here.

Thus, in summary, the RVGC 301 operates to produce the signal VREF_FSS that oscillates back and forth between the upper and lower bounds of the hysteresis band defined by VREF_H and VREF_L. As also described above, the specific behavior of VREF_FSS can be controlled by selecting appropriate values for VREF_H and VREF_L.

The comparator 348 receives Vosc on input 350 and VREF_FSS on input 352. Waveform 406 depicts the behavior of Vosc relative to the value of VREF_FSS at any given time (waveform 404). When Vosc is rising but below VREF_FSS (414), the output 358 of comparator 348 is low. Consequently, the switch 360 is open, and thus the capacitor 362 is charged by voltage supply 304 through the switch 346. The voltage across capacitor 362 is labeled Vdly, and waveform 408 depicts the behavior of Vdly. When Vosc is rising but is below VREF_FSS (414), Vdly is high (416). Thus, the inverter 364 provides a low CLK signal on output 368, and thus switch 356 is open, and capacitor 354 is charged by voltage supply 304 through the switch 344. As capacitor 354 continues charging, Vosc continues to rise, as 414 depicts in FIG. 4. Eventually, Vosc exceeds VREF_FSS, and the output 358 becomes high. This closes the switch 360, which causes the capacitor 362 to be shorted, and Vdly immediately becomes zero. This behavior is shown by the drop of Vdly at 424 from high to low at the moment Vosc exceeds VREF_FSS (FIG. 4). When Vdly becomes low, the inverter 364 produces a high CLK on output 368. This closes the switch 356, which shorts the capacitor 354 and drops Vosc to zero (low). This behavior is shown in FIG. 4, with Vosc dropping from high to low (422) when CLK becomes high (420), and more specifically, at the rising edge of the CLK pulse 420. When Vosc drops from high to low, the output 358 of the comparator 348 drops low, opening the switch 360 and allowing Vdly (the voltage across the capacitor 362) to quickly rise again back to a high state. Waveform 408 depicts this behavior (FIG. 4) at 424, with Vdly rising from low to high rapidly. Although Vdly rises over time at 424, the inverter 364 causes CLK to have square pulses. Because CLK is low, the switch 356 is open, and the capacitor 354 (Vosc) begins to rise again at 430, and the process repeats.

The frequency of CLK depends on how quickly or slowly the process just described is performed. The higher the value of reference voltage VREF_FSS on input 352, the longer it takes for Vosc to rise to exceed VREF_FSS, and thus the longer the time in between consecutive pulses of CLK (meaning that CLK frequency is lower). Conversely, the lower the value of reference voltage VREF_FSS on input 352, the shorter the time needed for Vosc to rise to exceed VREF_FSS, and thus the time in between consecutive pulses of CLK is reduced (meaning that CLK frequency is higher). Thus, raising VREF_FSS drops CLK frequency, and dropping VREF_FSS raises CLK frequency, so VREF_FSS and CLK frequency are inversely related. This behavior is seen in waveforms 400 and 402 (FIG. 4), where, as VREF_FSS rises, the frequency of CLK in waveform 402 gradually decreases. Similarly, this behavior is seen in waveforms 500 and 502 (FIG. 5), where, as VREF_FSS drops, the frequency of CLK in waveform 502 gradually rises. The behavior is also seen in FIG. 6, where the CLK frequency as depicted in waveform 610 rises to a high inflection point 624 when VREF_FSS is at the low inflection point 612, and waveform 610 drops to a low inflection point 632 when VREF_FSS is at a high inflection point 626, and so on with a low inflection point 640 of the waveform 604 and its corresponding high inflection point in the waveform 610, etc. The change in CLK frequency is also seen in waveform 608, which is more dense (frequency is higher) when VREF_FSS is at the low inflection point 612, and which is less dense (frequency is lower) when VREF_FSS is at the high inflection point 626. Thus, as described above, VREF_FSS can be controlled by selecting the appropriate values of VREF_H and VREF_L, and the frequency of CLK varies inversely with VREF_FSS, meaning that the frequency of CLK can be controlled by selecting the appropriate values of VREF_H and VREF_L.

Figure 7:
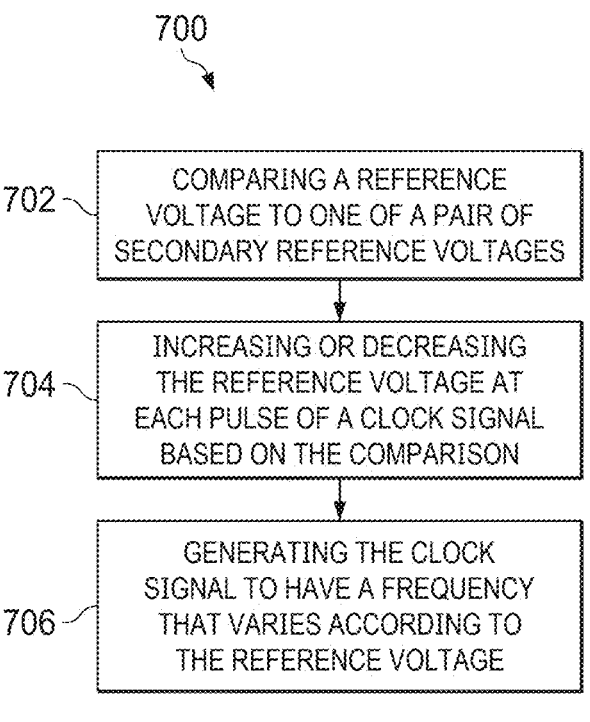
FIG. 7 is a flow diagram of a method for operating an FSS oscillator in accordance with examples described herein.

FIG. 7 is a flow diagram of a method 700 for operating an FSS oscillator in accordance with examples described herein. The method 700 may be performed by the FSS oscillator 104, for example. The method 700 includes comparing a reference voltage to one of a pair of secondary reference voltages (702). Referring to FIG. 3, the comparator 318 may compare the reference voltage VREF_FSS on input 320 to one of a pair of secondary voltages VREF_H and VREF_L on input 322, as described above. The method 700 includes increasing or decreasing the reference voltage at each pulse of a clock signal based on the comparison (704). Referring to FIG. 3, the reference voltage VREF_FSS increases or decreases as each pulse of CLK closes the switch 342, with increases occurring when node 336 is pulled high, and decreases occurring when node 336 is pulled low. The method 700 includes generating the clock signal to have a frequency that varies according to the reference voltage (706). Referring to FIG. 3, the frequency of CLK on output 368 rises as VREF_FSS falls, and the frequency of CLK on output 368 falls as VREF_FSS rises, as described in detail above. Steps of the method 700 may be added, deleted, or modified as appropriate.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the term "ground" in the foregoing description includes a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

As used herein, the terms "terminal," "node," "interconnection," "connection," "pin," and "lead" are used interchangeably. Unless specifically stated to the contrary, these terms are generally used to mean an interconnection between or a terminus of a device element, a circuit element, an integrated circuit, a device, or a semiconductor component. Furthermore, a voltage rail or more simply a "rail," may also be referred to as a voltage terminal and may generally mean a common node or set of coupled nodes in a circuit at the same potential.

What is claimed is:

1. An oscillator, comprising: a reference voltage generator circuit configurable to increase and decrease a reference voltage responsive to each pulse of a clock signal and a comparison of the reference voltage to a first voltage and a second voltage; and an oscillation circuit coupled to the reference voltage generator circuit and including a voltage generator, the voltage generator resettable by each pulse of the clock signal, and the oscillation circuit configurable to provide the clock signal responsive to a comparison between a third voltage at an output of the voltage generator and the reference voltage.

2. The oscillator of claim 1, wherein a frequency of the clock signal varies inversely with the reference voltage.

3. The oscillator of claim 1, wherein the reference voltage generator circuit comprises:
a comparator having a comparator output and first and second comparator inputs; and
an inverter having an inverter output and an inverter input, the inverter input coupled to the comparator output.

4. The oscillator of claim 3, wherein the inverter is configurable to pull the reference voltage on the first comparator input toward a voltage supply.

5. The oscillator of claim 4, wherein the comparator is configured to pull the voltage on the first comparator input toward ground.

6. The oscillator of claim 3, wherein the reference voltage is a first reference voltage, and wherein the second comparator input is configured to alternately receive the first and second voltages.

7. The oscillator of claim 3, wherein the second comparator input is coupled to a first switch having a first switch control terminal coupled to the inverter output and to a second switch having a second switch control terminal coupled to the comparator output.

8. The oscillator of claim 3, further comprising:
a current mirror having a first transistor coupled to a voltage supply and a second transistor coupled to a ground terminal;
a first switch coupled to the first comparator input and to a connection;
a second switch coupled to the first transistor and to the connection, the second switch having a second switch control terminal coupled to the inverter output; and
a third switch coupled to the second transistor and to the connection, the third switch having a third switch control terminal coupled to the comparator output.

9. The oscillator of claim 8, further comprising a capacitor coupled to the comparator output, to the first switch, and to the ground terminal.

10. An oscillator, comprising:
a reference voltage generator circuit configurable to provide a first reference voltage across a first capacitor, the reference voltage generator circuit comprising:
a first comparator configurable to perform a comparison to compare the first reference voltage to second and third reference voltages and to provide a first comparator output signal based on the comparison; and
first, second, and third switches coupled to the first comparator, the first and second switches configurable to increase the first reference voltage based on the comparison, and the first and third switches configurable to decrease the first reference voltage based on the comparison, the first switch operable by a clock signal; and
an oscillation circuit coupled to the reference voltage generator circuit and comprising:
a second comparator coupled to a second capacitor, the second comparator configurable to compare a voltage across the second capacitor to the first reference voltage to provide a second comparator output signal;

a third capacitor configurable to be charged based on the second comparator output signal;

an inverter configurable to provide the clock signal by inverting a voltage across the third capacitor; and a fourth switch configurable to control a voltage across the second capacitor based on the clock signal.

11. The oscillator of claim 10, further comprising a current mirror coupled to a voltage supply and to a ground terminal, the second switch coupled to the voltage supply and to a connection, the third switch coupled to the ground terminal and to the connection, and the first switch coupled to the connection and to an input of the first comparator.

12. The oscillator of claim 11, wherein the first capacitor is coupled to the input of the first comparator, the first switch, and the ground terminal.

13. The oscillator of claim 11, wherein:

the inverter is a first inverter;

the second switch has a second switch control terminal coupled to an output of a second inverter; and the third switch has a third switch control terminal coupled to an output of the first comparator, the output of the first comparator coupled to an input of the second inverter.

14. The oscillator of claim 10, further comprising a current mirror coupled to a voltage supply, wherein an input to the second comparator is coupled to the voltage supply by way of the current mirror, the input to the second comparator also coupled to the second capacitor.

15. The oscillator of claim 14, further comprising a fifth switch coupled in parallel to the third capacitor and coupled to an output of the second comparator.

16. The oscillator of claim 15, wherein the inverter has an inverter output and an inverter input, the inverter input coupled to the third capacitor, the inverter output coupled to the fourth switch, the fourth switch coupled in parallel with the second capacitor.

17. An oscillator, comprising:

a first comparator including a first comparator output and first and second comparator inputs, the first comparator input switchably coupled to multiple reference voltage terminals;

a first switch coupled to the second comparator input;

second and third switches coupled to each other and to the first switch, the second switch coupled to a power supply and the third switch coupled to a ground terminal;

a first capacitor coupled between the first switch and the second comparator input;

a first inverter having a first inverter output and a first inverter input, the first inverter input coupled to the first comparator output, the first inverter output coupled to the second switch;

a second comparator including a second comparator output and third and fourth comparator inputs, the third comparator input coupled to the power supply, the fourth comparator input coupled to the second comparator input;

a second capacitor coupled between the third comparator input and the ground terminal;

a fourth switch coupled in parallel to the second capacitor;

a fifth switch coupled to the second comparator output;

a third capacitor coupled in parallel to the fifth switch, the third capacitor and the fifth switch coupled to the power supply; and a second inverter having a second inverter output and a second inverter input, the second inverter output coupled to the fourth switch and the second inverter input coupled to the fifth switch and the third capacitor.

18. The oscillator of claim 17, further comprising a current mirror through which the second switch is coupled to the power supply and through which the third switch is coupled to the ground terminal.

19. The oscillator of claim 17, wherein the oscillator is configurable to increase and decrease a reference voltage at each pulse of a clock signal based on a comparison of the reference voltage to one of a pair of secondary reference voltages at the multiple reference voltage terminals.

20. The oscillator of claim 19, wherein the oscillator is configurable to generate the clock signal to have a frequency that varies according to the reference voltage.

* * * * *